(12) United States Patent
Troutman et al.

(10) Patent No.: US 10,208,381 B2
(45) Date of Patent: Feb. 19, 2019

(54) APPARATUS AND METHOD FOR MANAGING A TEMPERATURE PROFILE USING REFLECTIVE ENERGY IN A THERMAL DECOMPOSITION REACTOR

(71) Applicant: REC Silicon Inc, Moses Lake, WA (US)

(72) Inventors: Timothy Troutman, Butte, MT (US); Bryan J. Loushin, Butte, MT (US); Joe Ruschetti, Butte, MT (US)

(73) Assignee: REC Silicon Inc, Moses Lake, WA (US)

( * ) Notice: Subject to any disclaimer, the term of this patent is extended or adjusted under 35 U.S.C. 154(b) by 268 days.

(21) Appl. No.: 14/979,934

(22) Filed: Dec. 28, 2015

(65) Prior Publication Data

US 2016/0177447 A1    Jun. 23, 2016

Related U.S. Application Data

(63) Continuation of application No. PCT/US2015/067423, filed on Dec. 22, 2015.
(Continued)

(51) Int. Cl.
*C23C 16/48* (2006.01)
*C23C 16/46* (2006.01)
(Continued)

(52) U.S. Cl.
CPC .......... *C23C 16/481* (2013.01); *C01B 33/035* (2013.01); *C23C 16/24* (2013.01); *C23C 16/4418* (2013.01); *C23C 16/46* (2013.01)

(58) Field of Classification Search
CPC .................................. C01B 33/035
See application file for complete search history.

(56) References Cited

U.S. PATENT DOCUMENTS 3,809,571 A    5/1974  Berlat
4,150,168 A    4/1979  Yatsurugi et al.
(Continued)

FOREIGN PATENT DOCUMENTS

CN    102140678 A    8/2011
CN    102177275 A    9/2011
(Continued)

OTHER PUBLICATIONS

"Emissivity Coefficients." Engineering Toolbox. https://www.engineeringtoolbox.com/emissivity-coefficients-d_447.html Printed Jan. 19, 2018.*
(Continued)

*Primary Examiner* — Karla A Moore
*Assistant Examiner* — Tiffany Z Nuckols
(74) *Attorney, Agent, or Firm* — Klarquist Sparkman, LLP

(57) ABSTRACT

Embodiments of a reflective surface and a reflector comprising a reflective surface for use in a thermal decomposition reactor are disclosed. Methods for using the reflective surface, or reflector comprising the reflective surface, to manage a temperature profile in a silicon rod grown in the thermal decomposition reactor are also disclosed. The reflective surface is configured to receive radiant heat energy emitted from an energy emitting region of an elongated polysilicon body grown during chemical vapor deposition onto a silicon filament and reflect at least a portion of the received radiant heat energy to a reflected energy receiving region of the elongated polysilicon body or to a reflected energy receiving region of a second elongated polysilicon body, to thereby add radiant heat energy to the reflected energy receiving region.

21 Claims, 9 Drawing Sheets

Related U.S. Application Data

(60) Provisional application No. 62/096,435, filed on Dec. 23, 2014.

(51) Int. Cl.
*C23C 16/24* (2006.01)
*C23C 16/44* (2006.01)
*C01B 33/035* (2006.01)

(56) References Cited

U.S. PATENT DOCUMENTS

| | | |
|---|---|---|
| 4,805,556 A | 2/1989 | Hagan et al. |
| 5,382,419 A | 1/1995 | Nagai et al. |
| 5,545,387 A | 8/1996 | Keck et al. |
| 6,221,155 B1 | 4/2001 | Keck et al. |
| 6,544,333 B2 | 4/2003 | Keck et al. |
| 6,676,916 B2 | 1/2004 | Keck et al. |
| 2004/0261716 A1* | 12/2004 | Hashizume ............ C23C 16/24 118/723 E |
| 2007/0251455 A1 | 11/2007 | Wan et al. |
| 2011/0127676 A1 | 6/2011 | Lee et al. |
| 2011/0229638 A1 | 9/2011 | Qin et al. |
| 2011/0229717 A1 | 9/2011 | Kraus |
| 2011/0250366 A1 | 10/2011 | Pazzaglia et al. |
| 2011/0290184 A1 | 12/2011 | Yu et al. |
| 2011/0318909 A1 | 12/2011 | Gum et al. |

FOREIGN PATENT DOCUMENTS

| | | |
|---|---|---|
| CN | 103222041 A | 7/2013 |
| EP | 0536394 B1 | 6/1990 |
| KR | 10-2012-0123792 A | 11/2012 |
| WO | WO2010/042454 A1 | 4/2010 |
| WO | WO 2011/128729 | 10/2011 |
| WO | WO2012/013707 A1 | 2/2012 |

OTHER PUBLICATIONS

International Search Report and Written Opinion, dated Apr. 19, 2016, issued in corresponding International Application No. PCT/US2015/067423.

Chinese Intellectual Property Office, Notification of First Office Action, dated Nov. 5, 2018, issued in Chinese Patent Application No. 201580070261.3.

* cited by examiner

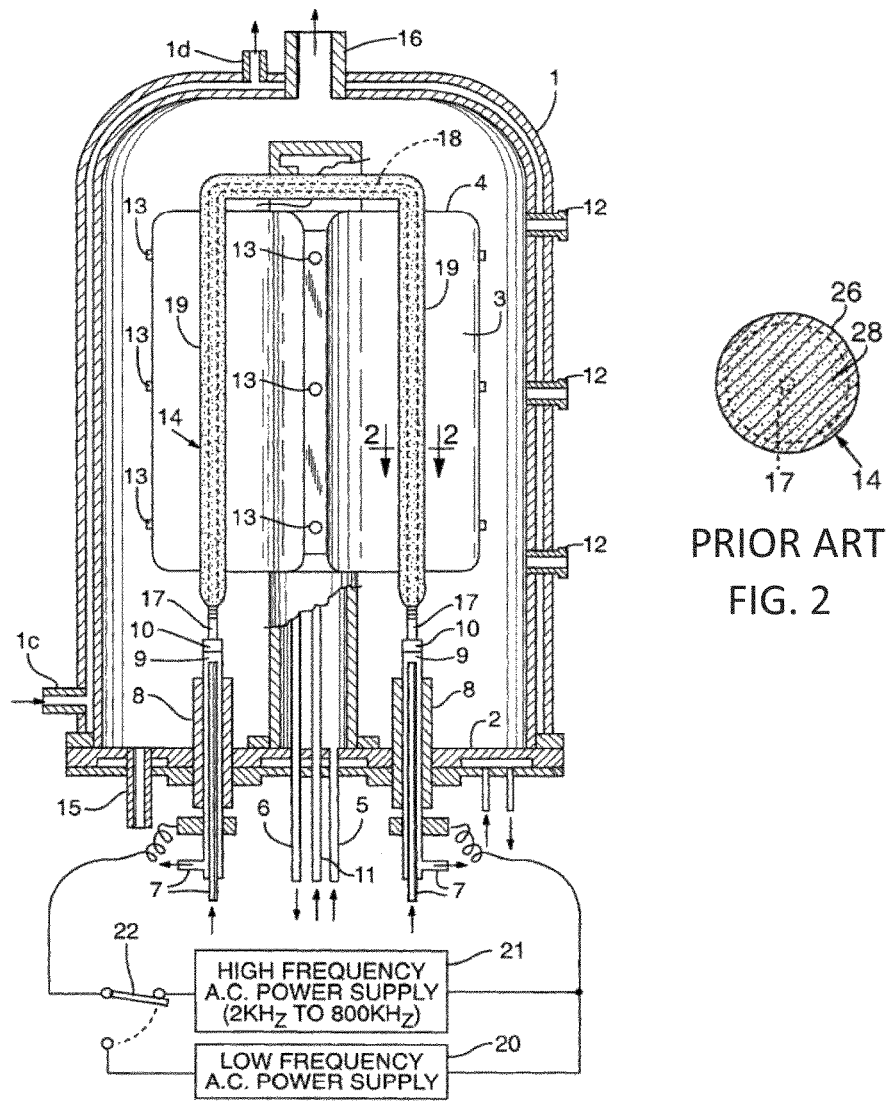
PRIOR ART
FIG. 2
PRIOR ART
FIG. 1

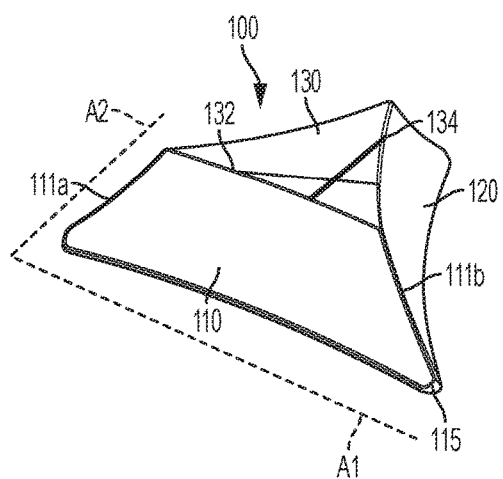
FIG. 3
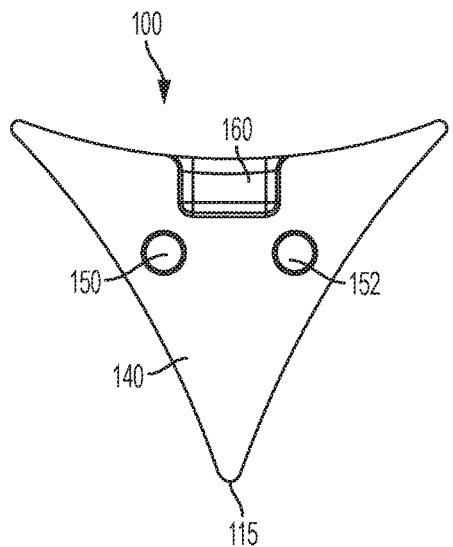
FIG. 4
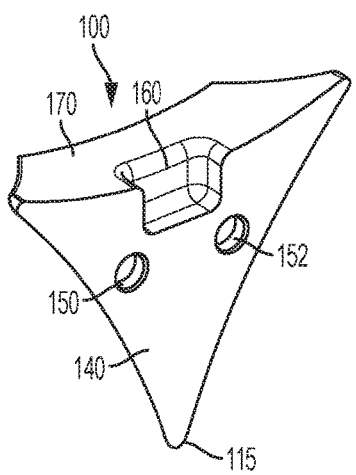
FIG. 5
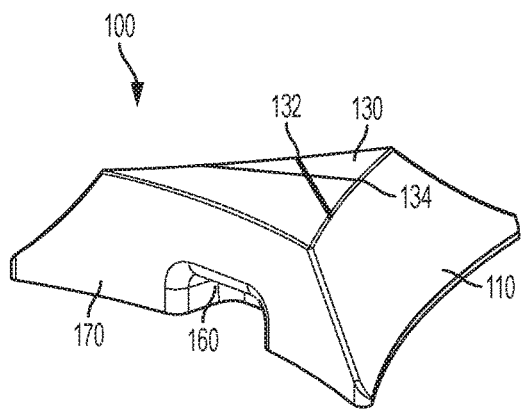
FIG. 6

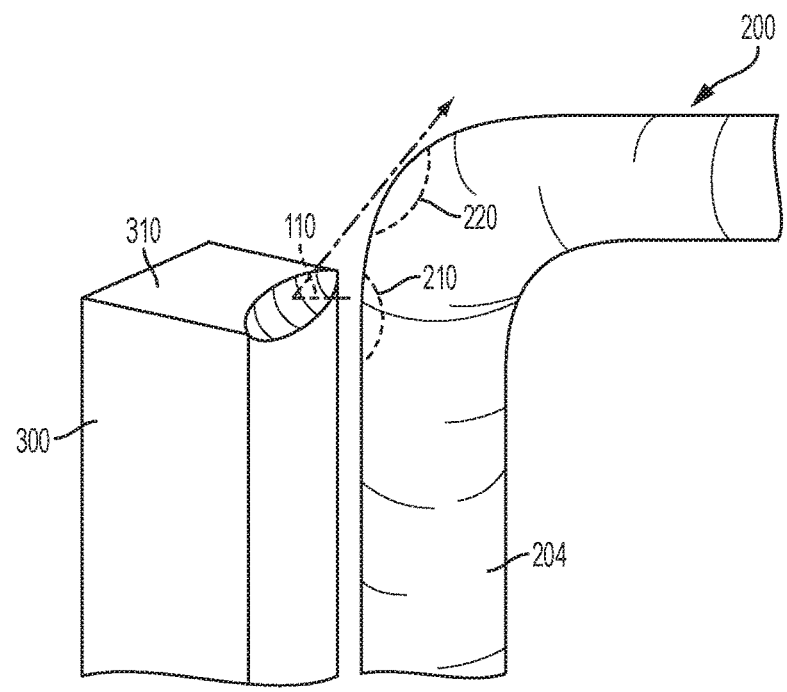
FIG. 7
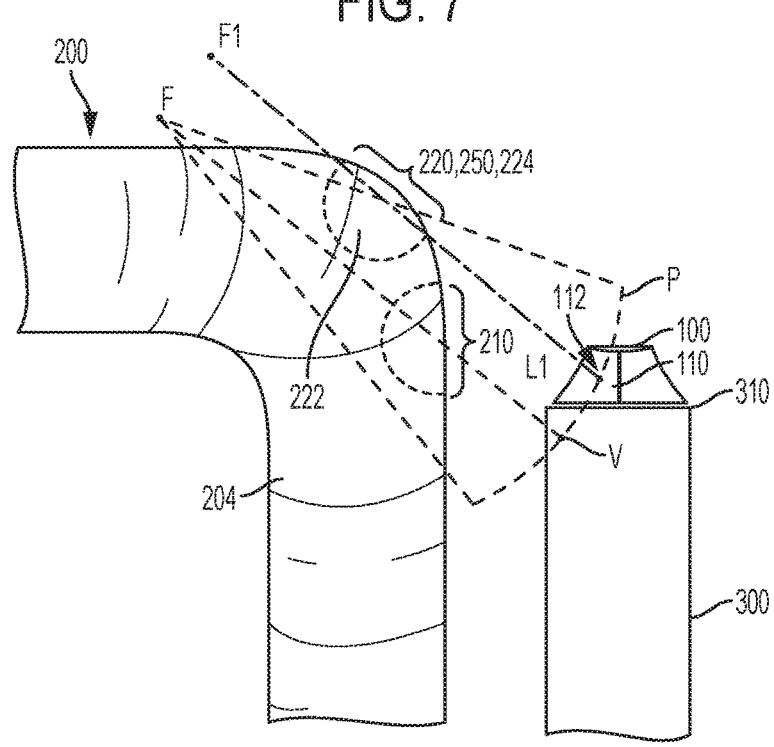
FIG. 8

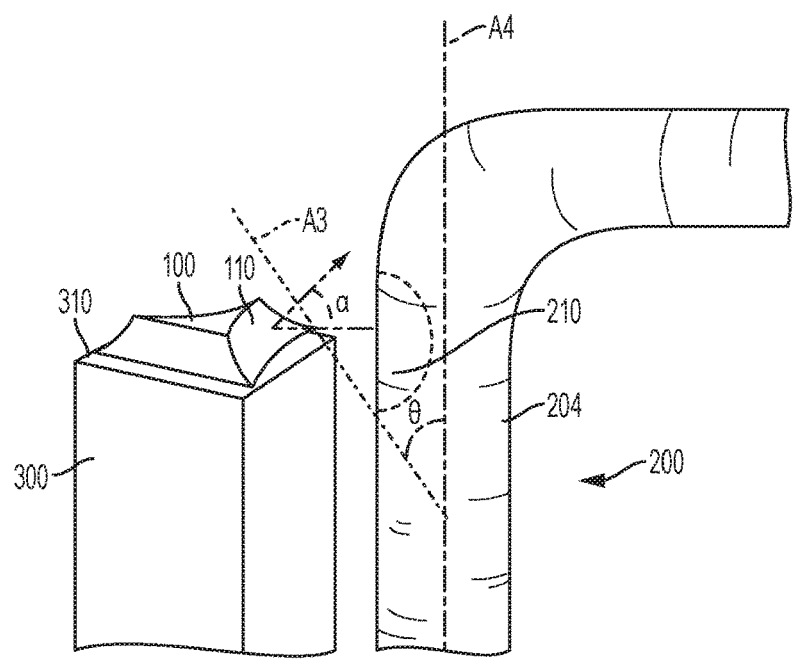
FIG. 9
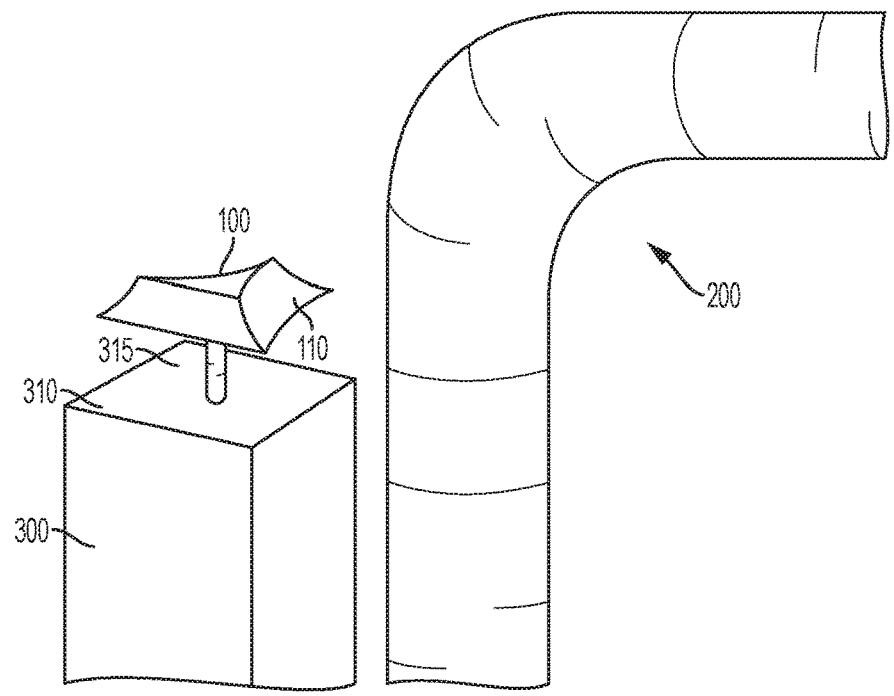
FIG. 10

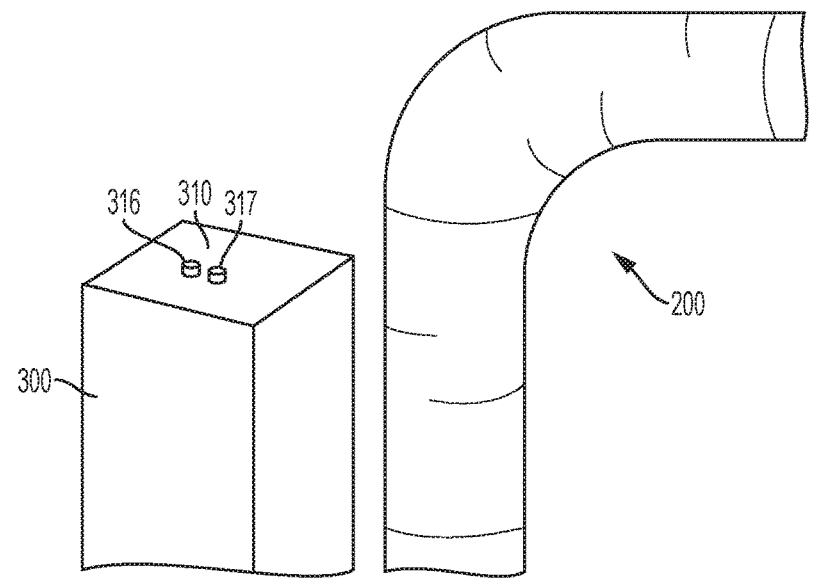
FIG. 11
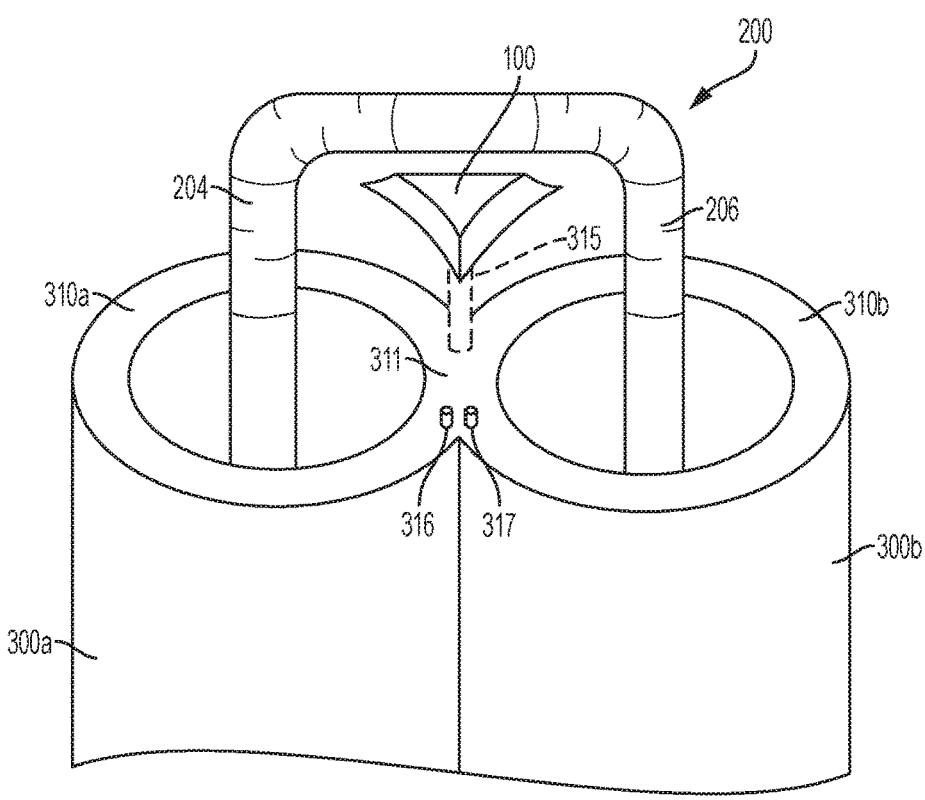
FIG. 12

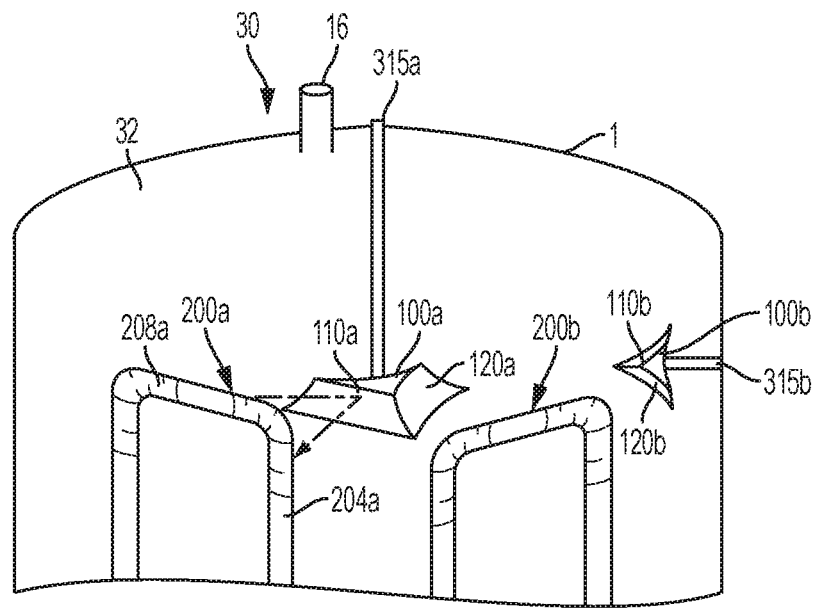
FIG. 13
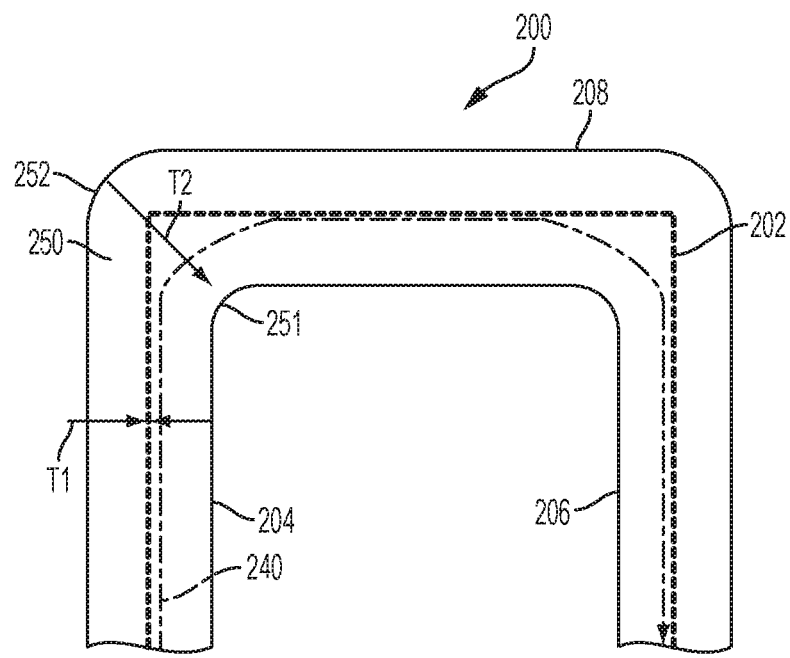
FIG. 14

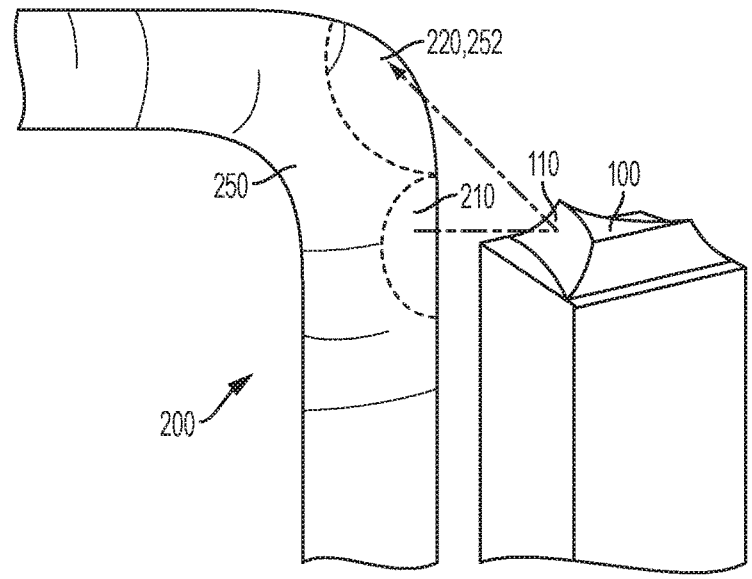
FIG. 15
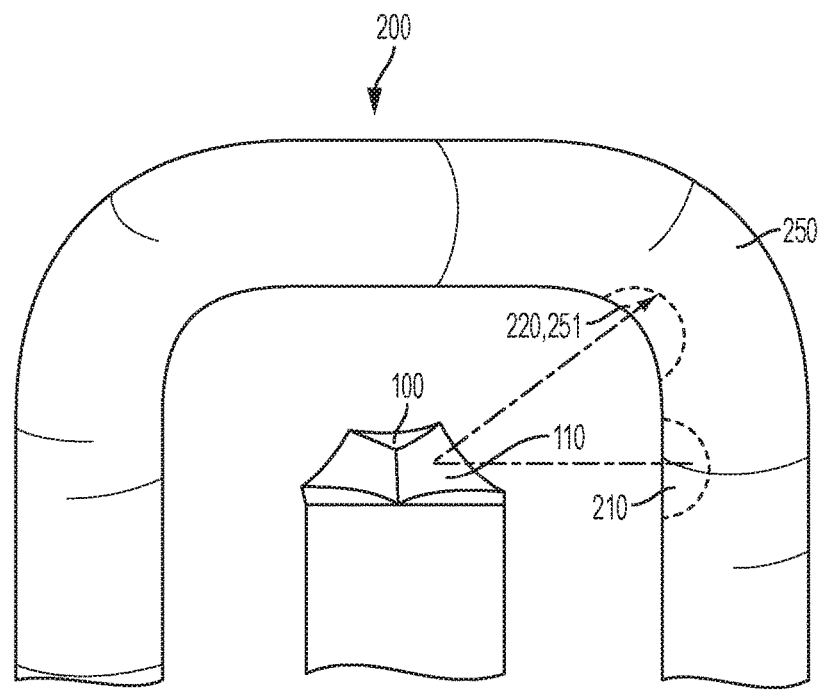
FIG. 16

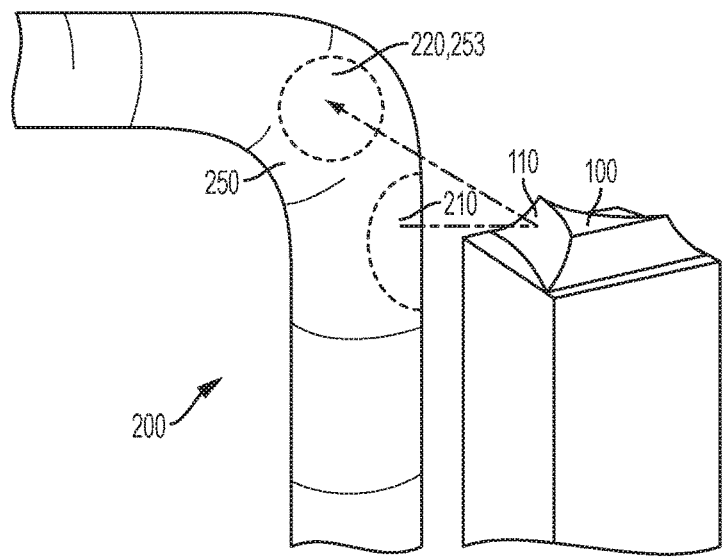
FIG. 17
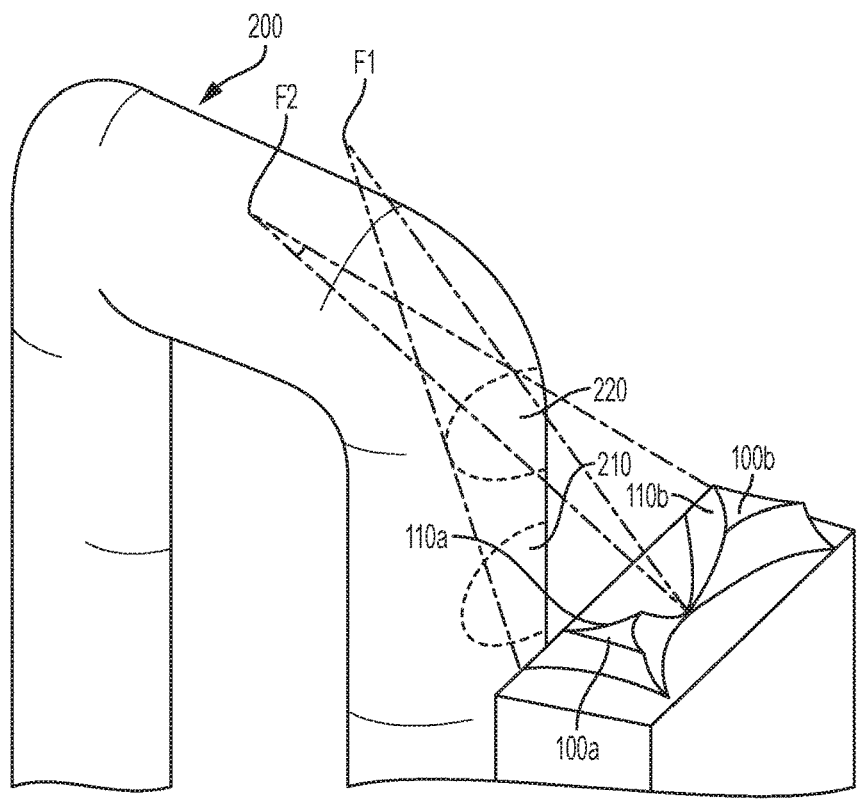
FIG. 18

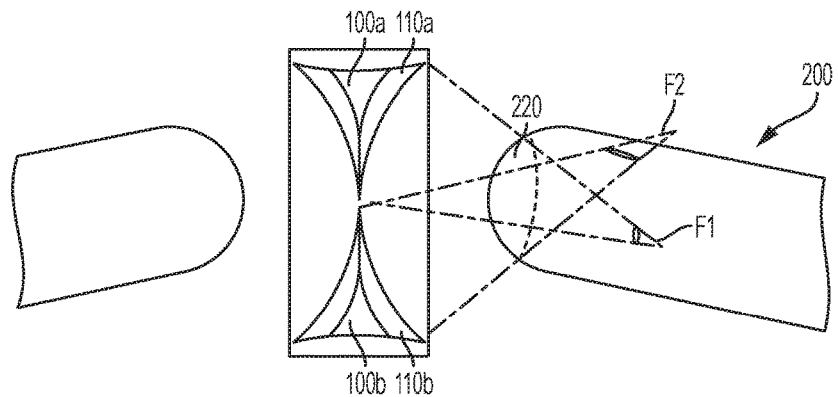
FIG. 19
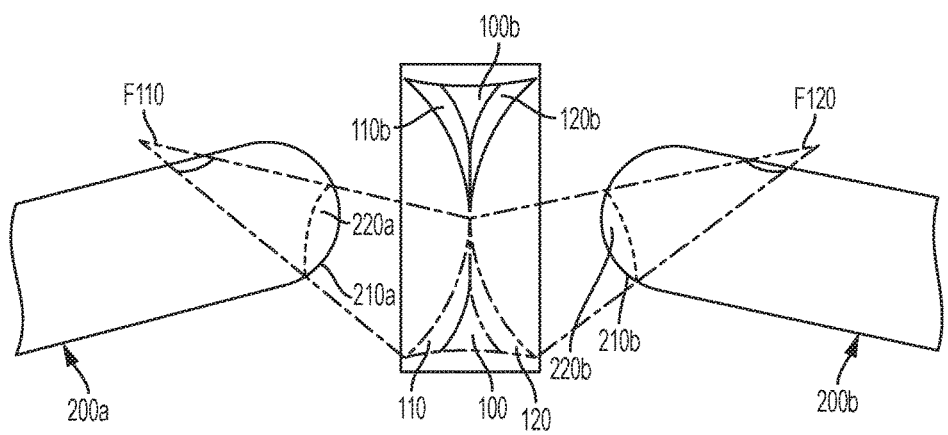
FIG. 20

APPARATUS AND METHOD FOR MANAGING A TEMPERATURE PROFILE USING REFLECTIVE ENERGY IN A THERMAL DECOMPOSITION REACTOR

CROSS REFERENCE TO RELATED APPLICATION

This is a continuation of International Application No. PCT/US2015/067423, filed Dec. 22, 2015, which claims the benefit of U.S. Provisional Application No. 62/096,435, filed Dec. 23, 2014.

This claims the benefit of U.S. Provisional Application No. 62/096,435, filed Dec. 23, 2014.

Both of the above-referenced prior applications are incorporated herein in their entireties by reference.

FIELD

This disclosure concerns a reflective surface and a reflector comprising a reflective surface for use in a thermal decomposition reactor, as well as a method of using a reflective surface and/or reflector in a thermal decomposition reactor.

BACKGROUND

In the semiconductor industry it is common practice to produce high purity silicon by a process known as chemical vapor deposition ("CVD"). In brief, certain substances having silicon content are heated to high temperatures within a reaction chamber causing them to undergo decomposition, while in the vapor state, and produce elemental silicon. Depending on the design of the reaction chamber, and whether or not it additionally contains deposition surfaces, the elemental silicon may be collected as a powder or as a rod. Such silicon is frequently referred to as polysilicon or polycrystalline silicon.

One of the widely practiced conventional methods of polysilicon production is via chemical vapor deposition of polysilicon in a thermal decomposition reactor, and is generally identified as the Siemens method. In this method polysilicon is deposited by decomposition of a silicon-containing gas such as for example trichlorosilane or monosilane ($SiH_4$), within the thermal decomposition reactor onto high-purity, joule or resistance heated, thin silicon filaments. Silicon deposits on the filaments, thereby growing elongated polysilicon bodies of increasing diameter, while the polysilicon bodies are maintained at elevated temperatures, typically from 700° C. to 1200° C.

Stresses are stored in the elongated polysilicon bodies following growth in a thermal decomposition reactor due to temperature differences across the diameter of the elongated bodies and/or throughout the length of the elongated bodies. Once growth is complete, and the rod begins to cool, the variance in temperature during growth manifests as stress due to the coefficient of thermal expansion. The magnitude of the stored stress increases with diameter. The filaments, and resulting elongated bodies formed in a thermal decomposition reactor, typically have an inverted U-shaped configuration with two vertical portions and a relatively horizontal bridge portion between the tops of the two vertical portions. The two vertical portions of the elongated body are connected to the bridge at bend, or corner, portions. As an elongated polysilicon body shrinks due to thermal contractions, the bridge portion tends to separate from the vertical portions of the elongated body. A fracture can propagate down the vertical portion of the elongated body, e.g., for a distance of 200-1000 mm. Intact vertical portions, or rods, obtained from an elongated polysilicon body are of greatest commercial value due to their length with uniform diameter. Fractures reduce the yield of such vertical portions. Fractured rods may not meet customers' minimum length requirements. In some cases, product losses reach 50% due to fractures. Accordingly, there is a need to mitigate or control stresses in the elongated polysilicon body, thereby mitigating or controlling fractures produced by the stresses.

SUMMARY

Embodiments of a reflective surface, a reflector comprising a reflective surface, and methods for use of the reflective surface in a thermal deposition reactor, such as a Siemens-type reactor, are disclosed. A device in a thermal decomposition reactor for producing one or more elongated polysilicon bodies by chemical vapor deposition of silicon onto one or more heated silicon filaments in a chamber of a reactor vessel comprises a reflector situated in the chamber, the reflector having at least one reflective surface. The reflective surface is configured to receive radiant heat energy emitted from an energy emitting region of an elongated polysilicon body grown during chemical vapor deposition onto a silicon filament and reflect at least a portion of the received radiant heat energy to a reflected energy receiving region of the elongated polysilicon body or to a reflected energy receiving region of a second elongated polysilicon body, to thereby supply radiant heat energy to the reflected energy receiving region. In one embodiment, the reflective surface is a surface of a reflector. In another embodiment, the reflective surface is provided as an integral portion of a component within the reactor, such as a nozzle, a pipe, a heat exchanger, a tube, a chamber wall, or the like. In some embodiments, the reflective surface is configured to direct reflected radiant heat energy at a three-dimensional surface, a two-dimensional area, a point, or a line on a polysilicon body surface at the reflected energy receiving region.

The reflective surface may be concave and in the shape of a portion of a paraboloid, a sphere, a tapered cylinder, or a cylinder, the cylinder having a longitudinal axis that is not parallel to a longitudinal axis of the energy emitting region of the elongated polysilicon body. In some embodiments, the reflective surface is substantially smooth with any surface irregularities having an average amplitude of less than 3 mm.

In some embodiments, the reflective surface or a reflector comprising the reflective surface is constructed of a material that does not evolve chemical species comprising Group III elements, Group V elements, metals, oxygen, or carbon during reactor operation; the reflector is constructed of, or plated with, a material having an emissivity <0.5; or a combination thereof. In certain embodiments, the reflective surface and/or the reflector is constructed of, or plated with, nickel, a nickel alloy, stainless steel, molybdenum, a molybdenum alloy, tungsten, a tungsten alloy, cobalt, a cobalt alloy, titanium, a titanium alloy, gold, a gold alloy, silver, a silver alloy, tantalum, or a tantalum alloy.

In some embodiments, a lower surface of the reflector defines one or more depressions configured to receive one or more protrusions of a structure on which the reflector is positioned, the reflector further comprises a cavity defined by portions of a lower surface and a rear surface of the reflector, and/or a surface of the reflector comprises one or more features to facilitate positioning, alignment, or positioning and alignment of the reflector within the thermal decomposition reactor.

When the reactor contains more than one elongated polysilicon body, the reflector may further have a second reflective surface to receive radiant heat energy from an energy emitting region of a second elongated polysilicon body during chemical vapor deposition and reflect at least a portion of the received radiant heat energy to a reflected energy receiving region of the second elongated polysilicon body or to a region of another elongated polysilicon body within the chamber, wherein the other elongated polysilicon body is the first elongated polysilicon body or a third elongated polysilicon body within the thermal decomposition reactor.

In some embodiments, the reactor vessel comprises adjacent first and second tubes that are configured to receive first and second vertical portions of the elongated polysilicon body grown by chemical vapor deposition onto an inverted U-shaped silicon filament comprising two vertical silicon filaments and a horizontal silicon filament, and the elongated polysilicon body has one or more bend portions between the first and second vertical portions of the elongated polysilicon body, which bend portions are situated outside the first and second tubes. In such embodiments, the reflector may be situated such that the reflective surface is positioned to (i) receive at least some radiant heat energy emitted from the energy emitting region of the elongated polysilicon body formed during the chemical vapor deposition and (ii) reflect at least a portion of the received radiant heat energy to the reflected energy receiving region. In one embodiment, the energy emitting region is a portion of the surface of the first vertical portion of the elongated polysilicon body, and the reflected energy receiving region is a portion of the surface of the elongated polysilicon body, which portion is at or near a bend portion of the elongated polysilicon body. In an independent embodiment, the energy emitting region is a portion of the surface of a bend portion or a horizontal portion of the elongated polysilicon body, which horizontal portion is between the first and second vertical portions, and the reflected energy receiving region is a portion of the surface of the first or second vertical portion of the elongated polysilicon body. In another independent embodiment, the reflective surface is an integral portion of the first tube and is located at the upper rim with the reflective surface oriented to receive radiant heat energy emitted from the energy emitting region of the elongated polysilicon body grown during the chemical vapor deposition, wherein the energy emitting region is a portion of the surface of the first vertical portion of the elongated polysilicon body.

Embodiments of a thermal decomposition reactor for producing an elongated polysilicon body comprise (i) a reactor vessel having a wall that defines a chamber, a gas inlet for admitting gas into the chamber, and a gas outlet for exhausting gas out of the chamber; (ii) a silicon filament in the chamber; (iii) an energy source for heating the silicon filament; (iv) a source of silicon-bearing gas fluidly connected to the gas inlet of the reactor vessel, wherein the silicon-bearing gas is a gas that is capable of decomposition at elevated temperatures to deposit silicon onto the silicon filament by chemical vapor deposition and grow an elongated polysilicon body; and (v) at least one reflective surface situated in the chamber, the reflective surface configured to receive radiant heat energy emitted from an energy emitting region of the elongated polysilicon body grown during chemical vapor deposition and reflect at least a portion of the received radiant heat energy to a reflected energy receiving region of the elongated polysilicon body or to a region of a second elongated polysilicon body within the chamber. The reflective surface may be formed on a component within the chamber and be an integral portion of the component, or the reflective surface may be provided by a reflector comprising the reflective surface as disclosed herein.

Embodiments of a method for producing an elongated polysilicon body include depositing silicon by chemical vapor deposition onto one or more heated silicon filaments heated in a chamber of a reaction vessel to grow one or more elongated polysilicon bodies, and during the depositing, reflecting radiant heat energy off of a first reflective surface positioned at a location within the reaction chamber such that the first reflective surface receives radiant heat energy emitted from an energy emitting region of a first elongated polysilicon body and reflects at least a portion of the received radiant heat energy to a reflected energy receiving region of the first elongated polysilicon body or to a second elongated polysilicon body. In some embodiments, providing the reflective surface comprises providing a reflector comprising the reflective surface as disclosed herein. In certain embodiments, the reflective surface is formed to be an integral portion of a component within the chamber, such as a pipe, a nozzle, a heat exchanger, a tube, a chamber wall, or the like. The reflective surface may be concave and in the shape of a portion of a paraboloid, a sphere, a tapered cylinder, or a cylinder, the cylinder having a longitudinal axis that is not parallel to a longitudinal axis of the energy emitting region of the first elongated polysilicon body when the reflective surface is provided at the location within the chamber.

In one embodiment, the energy emitting and reflected energy receiving regions are on the first elongated polysilicon body, wherein the energy emitting region is a relatively hot region and the reflected energy receiving region is a relatively cool region, and the method further includes positioning the reflective surface at a location within the chamber such that the radiant heat energy received from the energy emitting region and reflected to the reflected energy receiving region decreases a temperature gradient within the elongated polysilicon body. In an independent embodiment, (i) the energy emitting region is a portion of the surface of a vertical portion of the first elongated polysilicon body, (ii) the reflected energy receiving region is a portion of the surface of the elongated polysilicon body, which portion is at or near a bend portion of the first elongated polysilicon body, and (iii) the temperature gradient is within the bend portion, and the method further includes positioning the reflective surface at a location within the chamber such that received radiant heat energy is convergently reflected to the reflected energy receiving region. In another independent embodiment, the method further includes positioning the reflective surface at a location within the chamber such that the reflective surface is located (i) above the heated silicon filament from which the first elongated polysilicon body is grown or (ii) on an upper rim of a first tube pair within the chamber, wherein the first tube pair comprises adjacent first and second tubes that are configured to receive first and second vertical portions of a first elongated polysilicon body grown from a first heated, inverted U-shaped silicon filament comprising two vertical silicon filaments and a horizontal silicon filament, which horizontal silicon filament is situated outside the first and second tubes. When the reflective surface is positioned on the upper rim, the reflective surface may be an integral portion of the upper rim.

The method may further include providing a second reflective surface at a location within the chamber such that the second reflective surface receives radiant heat energy emitted from the energy emitting region of the first elongated polysilicon body during the chemical vapor deposition and reflects at least a portion of the received radiant heat energy to the reflected energy receiving region of the first elongated polysilicon body.

In some embodiments, the chamber comprises a first tube pair comprising adjacent first and second tubes that are configured to receive first and second vertical portions of a first heated, inverted U-shaped silicon filament comprising two vertical silicon filaments and a horizontal silicon filament, which horizontal silicon filament is situated outside the first and second tubes, and the method further includes positioning the reflective surface and the second reflective surface such that the reflective surface and the second reflective surface are located above the horizontal silicon filament or directly or indirectly on an upper rim of the first tube pair.

In some embodiments, a second elongated polysilicon body is grown in the chamber by chemical vapor deposition, and the method further includes providing a second reflective surface at a location within the chamber such that the second reflective surface receives radiant heat energy emitted from an energy emitting region of the second elongated polysilicon body and reflects at least a portion of the received radiant heat energy to a reflected energy receiving region of the second elongated polysilicon body or to a region of another elongated polysilicon body within the chamber, wherein the other elongated polysilicon body is the first elongated polysilicon body or a third elongated polysilicon body within the thermal decomposition reactor.

In any or all of the foregoing methods, the reflective surface is a surface of a reflector or an integral portion of a component within the chamber, and the second reflective surface, if present, independently is a second surface of the reflector, a surface of a second reflector, or an integral portion of a component within the chamber.

In some embodiments, a method of mitigating spall formation of an elongated polysilicon body prepared in a thermal decomposition reactor includes depositing silicon by chemical vapor deposition onto one or more heated silicon filaments heated in a reaction chamber of a reaction vessel to grow one or more elongated polysilicon bodies, and during the depositing, reflecting with a device as disclosed herein at least a portion of radiant heat energy emitted from an energy emitting region of the one or more elongated polysilicon bodies to a reflected energy receiving region of the one or more elongated polysilicon bodies, thereby reducing spall formation in the elongated polysilicon body compared to an elongated polysilicon body produced in a thermal decomposition reactor in the absence of the device.

The foregoing and other objects, features, and advantages of the invention will become more apparent from the following detailed description, which proceeds with reference to the accompanying figures.

BRIEF DESCRIPTION OF THE DRAWINGS

FIG. 1 is a schematic vertical sectional view showing a thermal decomposition reactor for the production of elongated polysilicon bodies by deposition of silicon from a silicon-bearing gas.

FIG. 2 is a sectional view taken along line 2-2 of FIG. 1 showing the cross section of a polysilicon body after it has been grown to a diameter greater than 150 mm.

FIG. 3 is an oblique view of an exemplary reflector as viewed from the front and top.

FIG. 4 is a bottom plan view of an exemplary reflector.

FIG. 5 is an oblique view of the reflector of FIG. 4 as viewed from the rear and bottom.

FIG. 6 is an oblique view of the reflector of FIG. 4 as viewed from the rear and top.

FIG. 7 is a schematic oblique view of a component for use in a thermal decomposition reactor, the component having an integral reflective surface.

FIG. 8 is a partial schematic oblique view of an interior portion of a thermal decomposition reactor containing an exemplary reflector having a reflective paraboloidal surface.

FIG. 9 is a partial schematic oblique view of an interior portion of a thermal decomposition reactor containing an exemplary reflector having a reflective cylindrical surface.

FIG. 10 is a schematic oblique view of a component for use in a thermal decomposition reactor, the component having a reflector mounted above an upper surface of the component.

FIG. 11 is a schematic oblique view of a component for use in a thermal decomposition reactor, the component comprising protrusions, or pins, for receiving a reflector.

FIG. 12 is a schematic oblique view of a tube pair for use in a thermal decomposition reactor, the tube pair having an upper rim with a reflector mounted on or above the upper rim.

FIG. 13 is a partial schematic oblique sectional view of an exemplary thermal decomposition reactor vessel including reflectors mounted via extenders to a cover of the reactor vessel.

FIG. 14 is a schematic elevational view of an elongated polysilicon body grown in a thermal decomposition reactor.

FIG. 15 is a partial schematic oblique view of an interior portion of a thermal decomposition reactor containing an exemplary reflector positioned to receive radiant heat energy emitted from a portion of the surface of a vertical region of an elongated polysilicon body and reflect at least a portion of the received energy to an outer surface of a bend portion of the elongated polysilicon body.

FIG. 16 is a partial schematic oblique view of an interior portion of a thermal decomposition reactor containing an exemplary reflector positioned to receive radiant heat energy emitted from a portion of the surface of a vertical region of an elongated polysilicon body and reflect at least a portion of the received energy to an inner surface of a bend portion of the elongated polysilicon body.

FIG. 17 is a partial schematic oblique view of an interior portion of a thermal decomposition reactor containing an exemplary reflector positioned to receive radiant heat energy emitted from a portion of the surface of a vertical region of an elongated polysilicon body and reflect at least a portion of the received energy to a side surface of a bend portion of the elongated polysilicon body.

FIG. 18 is a partial schematic oblique view of an interior portion of a thermal decomposition reactor containing two exemplary reflectors positioned to receive radiant heat energy emitted from an energy emitting region of an elongated polysilicon body and reflect at least a portion of the received energy to a reflected energy receiving region of the elongated polysilicon body.

FIG. 19 is a top plan view of an interior portion of a thermal decomposition reactor containing the two exemplary reflectors and elongated polysilicon body of FIG. 18.

FIG. 20 is a partial schematic oblique view of an interior portion of a thermal decomposition reactor containing an exemplary reflector with two reflective surfaces positioned to receive radiant heat energy emitted from vertical regions of adjacent first and second elongated polysilicon bodies, and reflect at least a portion of the received energy to bend portions of the first and second elongated polysilicon bodies.

DETAILED DESCRIPTION

A reflector comprising a reflective surface and methods for use of a reflective surface in a thermal deposition reactor, such as a Siemens-type reactor, are disclosed. Elongated polysilicon bodies produced in a reactor including the reflector have a lower propensity to fracture down the length of the polysilicon body. In some instances where the elongated polysilicon body is U-shaped with two vertical portions, a horizontal bridge portion, and bend portions where the horizontal bridge portion connects with the vertical portions, the elongated polysilicon body is more likely to break through the bend portion.

I. Definitions and Abbreviations

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

In order to facilitate review of the various embodiments of the disclosure, the following explanations of specific terms are provided:

Elongated polysilicon body: As used herein, the term "elongated polysilicon body" may refer to a substantially linear body, such as a polysilicon rod, or to a U-shaped polysilicon body including two vertical portions and a horizontal bridge portion connecting the two vertical portions.

Emissivity: Emissivity is a measure of the efficiency with which a surface emits thermal radiation. Mathematically, emissivity is the ratio of thermal radiation from a surface to the radiation from an ideal black surface at the same temperature. The ratio varies from 0 to 1. An emissivity of 1 indicates complete absorption of all incident light. Mirror-like, metallic surfaces that reflect light well have low emissivities. For example, a polished silver surface has an emissivity of about 0.02 near room temperature (20-23° C.).

Morphology: As used herein with respect to elongated polysilicon bodies produced by a chemical vapor deposition process, such as the Siemens process, the term "morphology" refers to defects in the polysilicon body, for example, cracks, stress lines, and/or deformities. In some examples, morphology refers to defects at the bend portions of the polysilicon body. The defects may produce a textured surface on the polysilicon body. Morphology may be classified by degree, e.g., minimal, light, heavy, etc. Alternatively, the degree of morphology may be assigned a numeric classification, e.g., on a scale from 0 to 10, where 0 indicates no defects, 1 indicates minimal morphology, 5 indicates moderate morphology, and 10 indicates heavy morphology.

Optical power: As used herein, the term "optical power" refers to the degree to which a reflective surface converges reflected radiant heat energy. Optical power is reciprocal of the focal length of the reflective surface—$P=1/f$, where $f$ is the focal length in meters.

Radiant heat energy: The energy of electromagnetic waves, e.g., thermal radiation.

Region: As used herein, the term "region" refers to a portion or volume of a polysilicon body.

Spall: As used herein, the term "spall" refers to cracks or fractures that form as a result of stresses (e.g., heat stresses) in elongated polysilicon bodies produced by a chemical vapor deposition process, such as the Siemens process. Spall may be characterized by degree of severity as determined, for example, by the distance that the cracks propagate down the vertical portions of an inverted U-shaped polysilicon body. Spall may be characterized as minimal, moderate, or severe. Alternatively, spall may be characterized on a numeric scale, e.g., from 0 to 15, where 0 indicates no spall, 1 indicates minimal spall, 5 indicates spall extending ⅕ the length of the vertical portion, 10 indicates spall extending ⅓ the length of the vertical portion, and 15 indicates spall extending ½ the length of the vertical portion.

II. Elongated Polysilicon Body Production

Elongated polysilicon bodies may be produced by chemical vapor deposition in a thermal deposition reactor, e.g., a Siemens-type reactor. One exemplary thermal decomposition reactor is described in U.S. Pat. No. 6,221,155, the pertinent portions of which are incorporated herein by reference, and shown in FIG. 1. A reactor vessel includes a cover or bell 1 and a base plate 2 that are mated together to provide a gas-tight wall that defines a chamber. A partition member 4, that is a heat exchanger or water jacket having a cooling water inlet pipe 5 and outlet pipe 6 and that is shaped to define multiple reaction chambers 3, is provided inside a cylindrical space defined by the cover 1 and base plate 2.

The cover 1 is at least partially hollow and serves as a water cooled heat exchanger or cooling jacket. Provided in the cover section are a cooling water inlet 1c and a cooling water outlet 1d. As it moves from the inlet 1c to the outlet 1d, cooling water flows through the space between the inner and outer walls of the cover. Electrodes 9 extend from below through the base plate 2, through the intermediation of insulating members 8, and are arranged at positions corresponding to the centers of the reaction chambers 3. Chucks 10 are attached to the tips of the electrodes 9 that are water cooled through inlet and outlet cooling pipes 7. The water flowing through the water cooling jacket may be replaced by another fluid cooling or a heating medium.

A reactant gas delivery pipe, or gas inlet, 11 extends upwardly from below through the base plate 2 and connects a plurality of gas nozzles 13 that are spaced to distribute a silicon bearing gas, such as monosilane gas, along the reaction chambers 3. An exhaust pipe, or gas outlet, 16 is used to remove spent reactant gas. Viewing windows 12 may be provided through the cover 1 and its cooling jacket to enable observation of the polysilicon bodies 14 during the deposition process. One or more sensors 23, such as pyrometers (not shown), may be used to monitor the surface temperature of polysilicon bodies growing in the reactor.

One or more energy sources are connected to the electrodes 9 to pass current through the polysilicon bodies 14 for heating the polysilicon bodies. The exemplary system shown in FIG. 1 includes a low frequency power supply 20, a high frequency power supply 21, and a switch 22 suitable to connect one or the other of the power supplies 20, 21 to the electrodes 9. Alternatively, the power supplies 20, 21 could be combined in a single, variable current power supply (not shown) that has integral switching circuitry and is capable of operating at both low and high frequencies.

Silicon filaments 17 are positioned in the reaction chambers 3 and held at their lower ends by the chucks 10. In the exemplary arrangement of FIG. 1, two silicon filaments 17 are connected to each other at their upper ends through a horizontal silicon filament, or bridge, 18 to provide a U-shaped filament on which an elongated polysilicon body 14 is formed. Cooling water is circulated through the cover 1.

Because silicon is not sufficiently electrically conductive at ambient temperature, the silicon filaments 17 may be preheated to a desired temperature, typically at least 200° C., to increase their conductivity. The surfaces of the preheated filaments then can be maintained at an elevated temperature by supplying electricity to the filaments through the electrodes 9 so the surfaces can serve as silicon deposition surfaces. Preheating can be accomplished by supplying a blast of hot inert gas through inlet 15 in the base plate 2 as described in U.S. Pat. No. 4,150,168 of Yatsurugi. Preheating can also be accomplished by operation of a radiant heat source (not shown) inside the reactor.

The filaments also may be preheated by directly supplying low frequency A.C. current thereto through the electrodes 9, as described in U.S. Pat. No. 4,150,168, but at a high voltage. For example, filaments may be heated by applying a voltage as high as 30,000 volts at a frequency of 60 Hz. After the silicon heats up beyond a temperature of 200° C., its resistance decreases with increasing temperature, so it has "broken into conduction." At that point, the voltage can be decreased to about 3,000 V and the 60 Hz current regulated to provide a desired silicon deposition surface temperature in the range of 600° C. to 1200° C. A silane gas, such as monosilane gas, is fed into the reactor through the gas pipe 11 and the gas nozzles 13. While ascending inside the reaction chambers 3, that are heated by the silicon starter filaments 17, the gas reacts to deposit polycrystalline silicon 19 on the surfaces of the silicon starter filaments 17. The deposited silicon builds up to grow elongated polysilicon bodies 14. Each starter filament 17 thus provides an initial silicon deposition surface, and after silicon is deposited on the filament, the outer surface of the deposited silicon serves as the deposition surface. With monosilane gas, desirable results are obtained when the deposition surface of a growing polysilicon body is maintained at a temperature of about 850° C. during deposition of silicon on the polysilicon body. Reactant gas that has been blown upwards beyond the reaction chambers 3 is removed through the exhaust pipe 16. While the growing polysilicon bodies are small, the current can be as low as 20 amps. As the polysilicon bodies increase in diameter, the current necessary to keep the silicon deposition surface at a constant temperature steadily increases while the required voltage decreases.

At some point, determined by the measurement of one or more parameters such as elapsed time, current consumption, a product attribute such as diameter, surface temperature or the like, the 60 Hz current may be turned off, for example by automated operation of the switch 22, and the elongated polysilicon body may be further maintained at a desired temperature by high frequency current supplied by the high frequency power source 21.

Heating current passing through a polysilicon body migrates to the surface of the polysilicon body because of the "skin effect." To take best advantage of the skin effect, the power supply may be configured to deliver current such that at least about 70% of the current is concentrated in an annular outer region of the polysilicon body 26 shown in FIG. 2, which outer region is the outer 15% of the radius of a polysilicon body being grown in a reactor. A lesser amount of current flows through a core or inner region 28 of the polysilicon body located inside the outer region 26.

Other configurations also may be suitable for growing elongated polysilicon bodies by CVD. For example, the reactor vessel may not include reaction chambers 3 as shown in FIG. 1. In some embodiments, silicon filaments 17 are not connected by a bridge portion 18 as shown in FIG. 1.

As elongated polysilicon bodies grow, stresses are stored within the polysilicon bodies. Internal stresses are caused, for example, by temperature variations across the diameter of the polysilicon body during CVD. The temperature in the polysilicon body's core may be 20-100° C. greater than the surface temperature during CVD. At the bend portions, in particular, hotter sections will contract more than cooler sections upon cooling, leading to spall and fractures. When making large-diameter elongated polysilicon bodies (e.g., ≥130 mm diameter, such as ≥150 mm diameter), slower growth rate conditions may be utilized to minimize risk of powder fall (i.e., formation of silicon powder and/or powder clumps instead of polysilicon body growth). Without wishing to be bound by a particular theory of operation, the slower growth rate conditions, however, may reduce bend portion morphology and increase internal stresses within the polysilicon body. The lack of morphology, or defects, combined with elevated internal stresses due to the increased diameter, increases spall and results in elongated polysilicon bodies of lesser value. Fractures that propagate down the vertical portion of the polysilicon body are of particular concern. Controlling the elevated internal stresses is difficult. For example, increasing the growth rate to increase morphology could result in a less desirable product and/or increase the probability of powder-fall, which in turn contributes to product fallout due to warts (i.e., protuberances caused by powder clumps adhering to the vertical portion of the polysilicon body).

III. Reflector

Disclosed herein are embodiments of a reflector for use in a thermal decomposition reactor. In some embodiments the reflector is useful for managing a temperature profile within an elongated polysilicon body grown by chemical vapor deposition onto a silicon filament in a thermal decomposition reactor. The reflector 100 has at least one reflective surface 110 configured to receive radiant heat energy emitted from an energy emitting region of a growing polysilicon body and direct at least a portion of the received radiant heat energy to a reflected energy receiving region of the elongated polysilicon body or to another elongated polysilicon body within the reactor, thereby managing a temperature profile with the elongated polysilicon body (FIG. 3). In some embodiments, the energy emitting region and the reflected energy receiving region are not coextensive. The reflective surface may have optical power. In some embodiments, the reflective surface has a focal length of 10-50 cm, such as a focal length of 15-40 cm, providing an optical power from 20 to 100 $m^{-1}$, or from 25 to 67 $m^{-1}$.

In some embodiments, the reflective surface 110 is concave and in the shape of a portion of a paraboloid, a sphere, a tapered cylinder (i.e., a conical shape), or a cylinder. The paraboloid reflecting surface may be designed by means of superposition of more than one parabolic surface to tailor the intended origin and destination of electromagnetic radiation. In some embodiments, the parabolic reflective surface may incorporate an astigmatism, that is: a surface with differing optical power on two orthogonal axes. For example, in FIG. 3, the reflective surface 110 has a first parabolic curvature along a first axis A1 and a second parabolic curvature along a second axis A2. The first and second parabolic curvatures may have optical powers that are the same or different from one another.

In some embodiments, the reflector 100 has a second reflective surface 120 that is configured to receive radiant heat energy emitted from an energy emitting region of a second polysilicon rod and direct at least a portion of the received radiant heat energy to a reflected energy receiving region of the second polysilicon rod or to a region of another polysilicon rod. The second reflective surface 120 also may be concave and in the shape of a portion of a paraboloid, a sphere, a tapered cylinder, or a cylinder. Reflective surfaces 110, 120 independently are concave portions of a paraboloid, a sphere, a tapered cylinder, or a cylinder that may be the same or different from one another. In one embodiment, reflective surfaces 110, 120 are mirror images of one another and have the same optical power. In another embodiment, reflective surfaces 110, 120 have different configurations and do not have the same optical power. A person of ordinary skill in the art understands that embodiments of the reflector could include one or more additional reflective surfaces, such that the reflector has 3, 4, or more reflective surfaces.

A surface of the reflector 100, such as an upper surface 130 of the reflector, may include one or more features 132, 134, which facilitate alignment and/or positioning of the reflector 100 prior to use. Alignment and/or positioning of the reflector also may include fixation of the reflector 100 in the thermal decomposition reactor. In some embodiments, edges and corners (e.g., corner 115) of the reflector may be rounded or squared for operator safety. A surface of the reflector 100, such as a lower surface 140 of the reflector, may include one or more depressions, such as depressions 150, 152 shown in FIGS. 4 and 5. Depressions 150, 152 may be used to position and/or align the reflector 100 on one or more retaining pins on a surface that receives the reflector. In one embodiment, the depressions include internal threads on inner walls of the depressions, and the retaining pins include external threads cooperatively dimensioned to engage with the internal threads of the depressions. Alternatively, other fixation means (e.g., welding, adhesives, etc.) may be utilized to align and retain the reflector.

A notch or cavity may be formed in a surface of the reflector. In the embodiment of FIGS. 4-6 a rectangular cavity 160 is provided in the lower surface 140 and rear surface 170 of the reflector 100. The cavity 160 is a holding cavity capable of receiving a tool or an operator's finger(s) to facilitate manipulation and positioning of the reflector 100.

In certain embodiments, the reflector is not a stand-alone device, and the reflective surface 110 instead is formed as an integral part of another reactor component within the chamber. For example, FIG. 7 illustrates a reactor component 300 having an upper surface 310. A reflective surface 110 is formed as the reactor component 300 is formed, or it may be subsequently machined into the reactor component.

The following discussion of reflective surface characteristics proceeds with reference to reflective surface 110. It should be understood, however, that the features described for reflective surface 110 also are applicable to reflective surface 120. If the reflector has more than two reflective surfaces, the features described for reflective surface 110 are applicable to each reflective surface.

In some embodiments, reflective surface 110 is concave in the shape of a portion of a paraboloid P. The reflective surface 110 receives radiant heat energy emitted from an energy emitting region 210 of an elongated polysilicon body 200. In the embodiment of FIG. 8, the energy emitting region 210 is a portion of the surface of a first vertical portion 204 of the polysilicon body 200. In some embodiments, the paraboloid P has a vertex V, a focus point F, and a paraboloid axis of symmetry As offset from a midpoint 112 of the reflective surface 110 (wherein, with reference to FIG. 3, the midpoint is equidistant from side edges 111a and 111b of the reflector surface 110) and parallel to a line L1 between the midpoint 112 of the reflective surface 110 and a center 222 of a reflected energy receiving region 220 of the polysilicon body 200, wherein the center 222 is defined as a point on the reflected energy receiving region intersected by line L1, which extends to the midpoint 112 of the reflective surface 110. In certain embodiments, L1 may extend to a point on the reflective surface 110 other than the midpoint 112, or may not intersect the reflective surface 110 at all. In the embodiment of FIG. 8, the reflected energy receiving region 220 is a portion of the surface of a bend portion 250 of the polysilicon rod 200.

The focus point F1 may be beyond the reflected energy receiving region 220, or between the reflector surface 110 and the reflected energy receiving region 220. When the focus point F1 is not on the reflected energy receiving region 220, the reflected energy is not focused at a point or a line on the reflected energy receiving region 220. Instead, the reflected energy strikes a three-dimensional surface as a receiving zone 224 on the reflected energy receiving region 220, wherein the receiving zone 224 has dimensions that vary based on the focus point F1 and the increasing diameter of the elongated polysilicon body 200 as it grows during the CVD process. In the embodiment of FIG. 8, the focus point F1 is beyond the reflected energy receiving region 220. In some embodiments, the focus point F1 may be on reflected energy receiving region 220 at a time point before or during CVD. Because the diameter of the elongated polysilicon body increases during CVD, the focus point F1 will not remain on the surface of the bend portion 250 throughout CVD. When the focus point F1 is on the reflected energy receiving region 220, the reflected energy will be focused at a point or a line on the reflected energy receiving region. The vertex V may or may not be included as a point on the reflective surface 110. In the illustrated embodiment of FIG. 8, the vertex V is not on the reflective surface 110.

When reflective surface 110 is a concave portion of a cylinder, the cylinder has a longitudinal axis that is not parallel to a longitudinal axis of the energy emitting region of the elongated polysilicon body. For example, in some embodiments, the elongated polysilicon body 200 comprises a first vertical portion 204 and the energy emitting region 210 is a portion of the surface of the vertical portion 204. In such embodiments, when reflective surface 110 is a concave portion of a cylinder, the cylinder has a longitudinal axis A3 that is not parallel to a longitudinal axis A4 of the first vertical portion 204 of the elongated polysilicon body 200 (FIG. 9). The angle θ of axis A3, relative to vertical, may be selected to provide a desired angle of reflection α for the radiant heat energy received from the energy emitting region 210. Accordingly, the reflective surface 110 reflects at least a portion of received radiant heat energy to a location other than the energy emitting region 210.

In an independent embodiment (not shown), the reflective surface is configured and/or positioned such that at least a portion of the received radiant energy is reflected back to the energy emitting region. In other words, the energy emitting region and reflected energy receiving region are the same region in this embodiment.

Advantageously, reflective surface 110 is substantially smooth with any surface irregularities having an average amplitude of less than 3 mm, such as an average amplitude of less than 1 mm, less than 100 µm, less than 50 µm, less than 30 µm, from 10 µm to 3 mm, from 10 µm to 1 mm, from 10-100 µm, from 10-50 µm, from 10-30 µm, or from 15-20 µm. The surface may be polished using a CNC (computer numerical control) optical polishing machine, e.g., to achieve a variance of less than 30 µm. The surface optionally is further electropolished (electrochemically polished). In another embodiment (not shown), the reflective surface 110 may be a Fresnel surface.

The surface area and emissivity of the reflective surfaces 110, 120 can be tuned to increase or decrease the amount of energy reflected back to the growing elongated polysilicon body. For example, as the surface area increases, the amount of energy received by the reflector and reflected back to the rod increases. Additionally, the reflective surface area may be increased to increase the size of the region that receives the reflected energy while maintaining uniform energy density. Emissivity is inversely correlated to the amount of energy received and reflected by the reflector. The reflector, and reflective surface, size may be determined at least in part by the placement of the reflector 100 in the thermal decomposition reactor vessel.

In some embodiments, the reflector 100 is sized appropriately for placement on an upper surface 310 of a reactor component 300 (FIGS. 8, 9). In one embodiment, the reflector 100 simply rests on the upper surface 310 of the reactor component 300. In an independent embodiment, the reflector 100 is secured directly to the upper surface 310 by any suitable means, e.g., by brazing or welding, using bolts or screws, or using a suitable adhesive.

In an independent embodiment, the reflector is mounted above the upper surface of the reactor component. In the exemplary embodiment of FIG. 10, the reflector 100 is mounted above the upper surface 310 of the reactor component 300 by means of an extender 315. In the exemplary embodiment of FIG. 11, protrusions, or pins, 316, 317 extend from the upper surface 310 of the reactor component 300. A reflector 100 is positioned on the upper surface 310. The lower surface of the reflector defines depressions that are sized and located to receive the pins 316, 317. The pins 316, 317 and reflector depressions (e.g., depressions 150, 152 shown in FIG. 4) may be sized so that the lower surface 140 of the reflector 100 contacts the upper surface 310 when the pins 316, 317 are received within the depressions. The pins 316, 317 also may aid in positioning and/or aligning the reflector 100 within the thermal decomposition reactor vessel 30.

In some embodiments, the thermal decomposition reactor includes a pair of tubes 300a, 300b, dimensioned to receive first and second vertical portions 204, 206 of an elongated polysilicon body 200. In the exemplary embodiment of FIG. 12, tubes 300a, 300b share a common wall portion 311 and have upper rims 310a, 310b. The reflector 100 is mounted on the shared portion 311 of the upper rims 310a, 310b, or alternatively above the shared portion 311 of the upper rims 310a, 310b by means of an extender 315. In an independent embodiment, protrusions, or pins, 316, 317 extend from the shared portion 311 and may be used to position and/or align the reflector on the shared portion 311 when the lower surface of the reflector defines depressions that are sized and located to receive the pins 316, 317.

In another independent embodiment, the reflector is mounted to a component of, or within, a thermal decomposition reactor vessel 30 comprising a cover 1 that defines a chamber 32 (FIG. 13). One or more reflectors 100a, 100b may be mounted, for example, to the cover 1. The reflectors 100a, 100b may be mounted by any suitable means. In the exemplary embodiment of FIG. 13, reflectors 100a, 100b are mounted to the cover by means of extenders 315a, 315b. Advantageously, the reflectors 100a, 100b are mounted such that at least one reflective surface 110a, 110b, 120a, 120b of each reflector is positioned to receive and reflect radiant heat energy emitted from elongated polysilicon bodies 200a, 200b being grown in the reactor. One or more reflectors may be mounted, optionally via an extender, to any other component within the reactor vessel, e.g., a pipe, a nozzle, a heat exchanger, an outer surface of a tube, or the like. In one non-limiting embodiment, the reflector 100a is positioned such that the reflective surface 110a receives radiant heat energy emitted from a bridge portion 208a of elongated polysilicon body 200a and directs at least a portion of the received radiant heat energy to a vertical portion 204a of the elongated polysilicon body 200a as indicated by the dashed arrow.

Advantageously, the reflector is constructed of a material capable of withstanding operating temperatures within the thermal decomposition reactor vessel without the reflector thermally decomposing or reacting with gases in the reactor vessel. In some arrangements, the reflector surface may be maintained at a temperature less than 450° C., such as less than 400° C., so that the silicon-bearing gas does not decompose and deposit silicon onto the reflector surface. The reflector may be kept at a suitable temperature by placing the reflector at a sufficient distance from the polysilicon rod surface. In one non-limiting example, the reflector is placed at a distance that is approximately 10-25 cm from an outer surface of the polysilicon rod when the polysilicon rod is fully grown, i.e., at its maximum diameter. In another non-limiting example, the reflector is placed at a distance that is approximately 75-100 cm from the center of the starter filament. In another example, the reflector may be placed on or connected to a cooled surface. The tubes may be water-cooled, and the reflector may be placed on an upper rim of a water-cooled tube.

In some embodiments, the reflector is made of, or plated with, a material that does not evolve chemical species comprising Group III elements (e.g., boron, aluminum), Group V elements (e.g., phosphorus), metals, oxygen, or carbon during reactor operations. The reflector may be constructed from, or plated with, a material having an emissivity <0.5.

In some embodiments, the reflector is constructed of, or plated with, stainless steel, or a metal or metal alloy, wherein the metal is nickel, molybdenum, tungsten, cobalt, titanium, gold, silver, or tantalum. Suitable alloys include, but are not limited to, 304L stainless steel (≤0.03% C, ≤2% Mn, ≤0.045% P, ≤0.03% S, ≤0.75% Si, 18-20% Cr, 8-12% Ni, ≤0.1% N, balance Fe), 316 stainless steel (≤0.08% C, ≤2% Mn, ≤0.045% P, ≤0.03% S, ≤0.75% Si, 16-18% Cr, 10-14% Ni, 2-3% Mo, ≤0.1% N, balance Fe), 321 stainless steel (≤0.08% C, ≤2% Mn, ≤0.045% P, ≤0.03% S, ≤0.75% Si, 17-19% Cr, 9-12% Ni, ≤0.7% Ti, ≤0.1% N, balance Fe), 405 stainless steel (0.1-0.3% Al, ≤0.08% C, 11.5-14.5% Cr, ≤1%

Mn, ≤0.5% Ni, ≤0.04% P, ≤1% Si, ≤0.03% S, balance Fe), 440 stainless steel (440A=0.6-0.75% C, ≤1% Mn, ≤0.04% P, ≤0.03% S, ≤1% Si, 16-18% Cr, ≤0.75% Mo, balance Fe), 2011 aluminum (0.2-0.6% Bi, 5-6% Cu, ≤0.7% Fe, 0.2-0.6% Fe, ≤0.4% Si, ≤0.3% Zn, other ≤0.005% each/≤0.15% total, balance Al), 6061 aluminum (0.04-0.35% Cr, 0.15-0.4% Cu, 0-0.7% Fe, 0.8-1.2% Mg, ≤0.15% Mn, other ≤0.005% each/≤0.15% total, 0.4-0.8% Si, ≤0.15% Ti, ≤0.25% Zn, balance Al), 200 nickel (≤0.15% C, ≤0.25% Cu, ≤0.4% Fe, ≤0.35% Mn, ≤0.35% Si, ≤0.01% S, ≥99% Ni), 270 nickel (≤0.01% Cu, ≤0.05% Fe, ≤0.003% Mn, ≤0.02% C, ≤0.003% S, ≤0.005% Ti, ≤0.005% Mg, ≤0.005% Si, ≥99.9% Ni), and titanium 6-4 (6% Al, ≤0.25% Fe, ≤0.2% 0, 90% Ti, 4% V).

IV. Reflector Positioning and Methods of Using the Reflector

When an electrical current passes through a polysilicon filament and an elongated polysilicon body grows via silicon deposition within the thermal decomposition reactor, there is a radial temperature gradient in the elongated polysilicon body, which can affect growth rates and/or morphology in regions of the elongated polysilicon body. In the exemplary embodiment of FIG. 14, the elongated polysilicon body 200 grown by silicon deposition onto an inverted U-shaped filament 202 has a first vertical portion 204, a second vertical portion 206, and a bridge portion 208 between the first and second vertical portions 204, 206. The portions of the elongated polysilicon body at the junctions between the bridge portion 208 and the first and second vertical portions 204, 206 are referred to as bend portions 250. As indicated by the arrows of the line T1, the core temperature of the polysilicon body 200 near the filament 202 is higher than the temperature near the polysilicon body surface. The temperature gradient results from the current flowing through the polysilicon body 200, which current flow is greater near the center of the polysilicon body 200. The temperature gradient T1 is further increased because silicon resistance is lower in regions where the temperature is higher and thus more current flows through the hotter regions. In some instances, the core temperature near the silicon filament 202 may be 20-100° C. hotter than the polysilicon body surface.

As the electrical current passes through a bend portion 250 of the elongated polysilicon body 200, the path 240 of the current passes closer to an inner surface 251 of the bend portion 250 than to an outer surface 252 of the bend portion, thereby producing an additional temperature gradient T2 through the bend portion 250, wherein the temperature increases in the direction of the arrow. In some embodiments, the inner surface 251 has a temperature greater than 900° C., such as a temperature from 900-1200° C. or from 1000-1200° C. The outer surface 252 has a temperature less than the outer surface 251, producing a temperature gradient T2 greater than 200° C. through the bend portion 250. For example, the outer surface 252 may have a temperature less than 700° C.

In some embodiments, a reflective surface is positioned relative to an elongated polysilicon body being grown during chemical vapor deposition onto a silicon filament such that the reflective surface receives radiant heat energy emitted from an energy emitting region of the elongated polysilicon body and reflects at least a portion of the received radiant heat energy to a reflected energy receiving region of the elongated polysilicon body or to another elongated polysilicon body within the thermal decomposition reactor; in some embodiments, the energy emitting region and the reflected energy receiving region are not coextensive. The reflective surface may be an integral portion of a component within the reactor, e.g., a pipe, a nozzle, a heat exchanger, an outer surface of a tube, or the like. Alternatively, the reflective surface may be a surface of a reflector as disclosed herein. In embodiments where the reflector has a second reflective surface, the second reflective surface may receive radiant heat energy from an energy emitting region of a second elongated polysilicon body and reflect at least a portion of the received radiant heat energy to a reflected energy receiving region of the second elongated polysilicon body or to another elongated polysilicon body within the thermal decomposition reactor. Many arrangements of the reflective surfaces, reflectors including the reflective surfaces, and the elongated polysilicon bodies are contemplated within the scope of this disclosure.

In some embodiments, the energy emitting region is a portion of the surface of a vertical portion of the elongated polysilicon body and the reflected energy receiving region is a portion of the surface of a bend portion of the elongated polysilicon body. Reflecting radiant heat to the bend portion is a method to alter bend portion morphology (e.g., increase or decrease texture the bend portion surface and/or within the bend portion). A suitably shaped and positioned reflective surface will reflect radiant heat energy from a portion of the surface of a vertical portion of the elongated polysilicon body to a portion of the surface of the bend portion, thereby affecting the bend portion morphology and/or rate of growth. Advantageously, the reflective surface is shaped and positioned to have little or no effect on the morphology of the vertical portions of the polysilicon body. The surface area and emissivity of the reflective surfaces can be tuned to increase or decrease the amount of energy reflected back to the growing polysilicon body and to optimize the bend portion morphology and/or growth rate. Decreasing the bend portion morphology decreases the likelihood that the elongated polysilicon body will fracture through the bend portion as it cools and decreases the likelihood that an uncontrolled fracture will propagate down the vertical portion of the elongated polysilicon body. The elongated polysilicon body can be cut as desired after it has cooled. In contrast, increasing the bend portion morphology increases the likelihood that the elongated polysilicon body will fracture through the bend portion, and may reduce undesirable fracture propagation down the vertical portion of the polysilicon body by controlling where the fracture occurs and confining the fracture to the bridge portion.

In one embodiment, a reflective surface 110 is positioned lateral to a vertical portion 204 of an elongated polysilicon body 200 (FIG. 7). The reflective surface 110 may be an integral part of an upper portion 310 of a reactor component 300, such as a pipe, a nozzle, a heat exchanger, an outer surface of a tube, or the like. The reflective surface 110 is configured to receive radiant heat energy emitted from an energy emitting region 210 and reflect at least a portion of the received radiant heat energy to a reflected energy receiving region 220 of the elongated polysilicon body 200 as indicated by the dashed arrow.

In one embodiment, a reflector 100 is positioned lateral to an energy emitting region 210 of an elongated polysilicon body 200 (FIG. 15). The reflector 100 has a reflective surface 110 configured to receive radiant heat energy emitted from the energy emitting region 210 and reflect at least a portion of the received radiant heat energy to a reflected energy receiving region 220 of the elongated polysilicon body 200 as indicated by the dashed arrow. In the embodiment of FIG. 15, the reflected energy receiving region 220 is an outer surface 252 of a bend portion 250. The reflector 100 is effective to reduce a temperature gradient through the bend portion 250 by reflecting thermal radiation to the cooler outer surface 252 of the bend portion 250. The reduced temperature gradient regionally changes the surface temperature which modifies the radial growth rate.

In an independent embodiment, a reflector 100 is positioned medial to an energy emitting region 210 of an elongated polysilicon body 200 (FIG. 16). The reflector 100 has a reflective surface 110 configured to receive radiant heat energy emitted from the energy emitting region 210 and reflect at least a portion of the received radiant heat energy to a reflected energy receiving region 220 of the elongated polysilicon body 200 as indicated by the dashed arrow. In the embodiment of FIG. 16, the reflected energy receiving region 220 is an inner surface 251 of a bend portion 250.

In an independent embodiment, a reflector 100 is positioned lateral to an energy emitting region 210 of an elongated polysilicon body 200 (FIG. 17). The reflector 100 has a reflective surface 110 configured to receive radiant heat energy emitted from the energy emitting region 210 and reflect at least a portion of the received radiant heat energy to a reflected energy receiving region 220 of the elongated polysilicon body 200 as indicated by the dashed arrow. In the embodiment of FIG. 17, the reflected energy receiving region 220 is a side surface 253 of a bend portion 250.

Two or more reflectors may be positioned to reflect radiant heat energy to a single elongated polysilicon body. In one embodiment, two reflectors 100a, 100b are positioned to reflect radiant heat energy to an elongated polysilicon body 200 (FIGS. 18, 19). Reflectors 100a, 100b are positioned lateral to an energy emitting region 210 of the elongated polysilicon body 200. Reflective surfaces 110a, 110b are configured to receive radiant heat energy emitted from the energy emitting region 210 and reflect at least a portion of the received radiant heat energy to a reflected energy receiving region 220 of the elongated polysilicon body 200 as indicated by the dashed arrows. Each reflector 110, 110a has a focus point F1, F2, respectively, beyond the reflected energy receiving region 220.

A reflector 100 with first and second reflective surfaces 110, 120, may be positioned between two adjacent elongated polysilicon bodies 200a, 200b (FIG. 20). In some embodiments, the reflector 100 is placed equidistant from the two polysilicon bodies 200a, 200b. The reflector 100 receives radiant heat energy from, and reflects at least a portion of the received radiant heat energy to, the adjacent polysilicon bodies 200a, 200b. The first reflective surface 110 is configured to receive radiant heat energy emitted from an energy emitting region 210a of a first elongated polysilicon body 200a, and reflect at least a portion of the received radiant heat energy to a reflected energy receiving region 220a of the first elongated polysilicon body 200a. The reflective surface 110 has a focus point F110 beyond the reflected energy receiving region 220a. A second reflective surface 120 is configured to receive radiant heat energy emitted from an energy emitting region 210b of a second, adjacent elongated polysilicon body 200b, and reflect at least a portion of the received radiant heat energy to a reflected energy receiving region 220b of the second elongated polysilicon body 220b. The reflective surface 120 has a focus point F120 beyond the reflected energy receiving region 220b.

Optionally, a second reflector 100b with first and second reflective surfaces 110b, 120b is positioned between the two adjacent elongated polysilicon bodies 200a, 200b (FIG. 20). The second reflector 100b also receives radiant heat energy from, and reflects at least a portion of the received radiant heat energy to, the adjacent polysilicon bodies 200a, 200b. The regions from which the reflective surfaces 110b, 120b receive radiant heat energy, and reflect radiant heat energy to, may be the same or different than the regions upon which the first reflector 100 acts. In the exemplary embodiment of FIG. 20, the first reflective surface 110b is configured to receive radiant heat energy emitted from the energy emitting region 210a of the first elongated polysilicon body 200a, and reflect at least a portion of the received radiant heat energy to the reflected energy receiving region 220a of the first elongated polysilicon body 200a. The second reflective surface 120 is configured to receive radiant heat energy emitted from the energy emitting region 210b of the second elongated polysilicon body 200b, and reflect at least a portion of the received radiant heat energy to the reflected energy receiving region 220b of the second elongated polysilicon body 220b.

In some embodiments, a thermal decomposition reactor vessel has a cover defining a chamber that contains a first tube pair comprising adjacent first and second tubes that are configured to receive first and second vertical portions of an elongated polysilicon body grown by chemical vapor deposition onto a silicon filament. The elongated polysilicon body has one or more bend portions between the first and second vertical portions which are situated outside the tubes. The bridge portion of the polysilicon body is also situated outside the tubes. A reflector is positioned on an upper rim of the first tube such that the reflective surface receives at least some radiant heat energy emitted from the energy emitting region of the elongated polysilicon body during the chemical vapor deposition, and reflects at least a portion of the received radiant heat energy to the second portion of the elongated polysilicon body. In another embodiment, the energy emitting region is the first vertical portion of the polysilicon body, and the reflected energy receiving region is a bend portion adjacent to the first vertical portion.

In some embodiments, the chamber further contains a second tube pair proximate the first tube of the first tube pair. The second tube pair comprises adjacent third and fourth tubes that are configured to receive first and second vertical portions of a second elongated polysilicon body grown on a second silicon filament during the chemical vapor deposition. The fourth tube has an upper rim contiguous with the upper rim of the first tube. The reflector is positioned on a shared portion of the upper rims. A second reflective surface of the reflector receives radiant heat energy emitted from an energy emitting region of the second elongated polysilicon body, and directs at least a portion of the received radiant heat energy to a reflected energy receiving region of the second polysilicon body.

In an independent embodiment, a thermal decomposition reactor comprises a cover that defines a chamber. The chamber contains a first tube pair comprising adjacent first and second tubes that are configured to receive first and second vertical portions of an elongated polysilicon body. The chamber further contains a second tube pair comprising adjacent third and fourth tubes that are configured to receive first and second vertical portions of a second elongated polysilicon body. A reflector is positioned such that a first reflective surface receives radiant heat energy emitted from an energy emitting region of the first polysilicon body and directs at least a portion of the received radiant heat energy to a reflected energy receiving region of the second polysilicon body. The reflector may be mounted via an extender to the cover of the reactor vessel. Alternatively, the reflector may be positioned on an upper rim of one of the tubes, or it may be mounted directly or via an extender to another component within the chamber.

In an independent embodiment, a reactor vessel comprises a cover that defines a chamber. The chamber contains a first tube pair comprising adjacent first and second tubes that are configured to receive first and second vertical portions of an elongated polysilicon body grown by chemical vapor deposition onto a silicon filament. The elongated polysilicon body has one or more bend portions between the first and second vertical portions of the polysilicon body, which bend portions are situated outside the first and second tubes. The bridge portion of the polysilicon body is also situated outside the first and second tubes. A reflective surface is an integral portion of an upper rim of the first tube with the reflective surface oriented to receive at least some radiant heat energy emitted from the energy emitting region of the polysilicon body during the chemical vapor deposition, and reflect at least a portion of the received radiant heat energy to the second portion of the polysilicon body. In an exemplary embodiment, the energy emitting region is a portion of the surface of the first vertical portion of the elongated polysilicon body, and the reflected energy receiving region is a portion of the surface of a bend portion adjacent to the first vertical portion.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims.

We claim:

1. In a thermal decomposition reactor for producing one or more elongated polysilicon bodies by chemical vapor deposition of silicon onto one or more heated silicon filaments in a chamber of a reactor vessel, a device comprising:
    at least one reflector situated in the chamber, the reflector having a reflective surface configured to receive radiant heat energy emitted from an energy emitting region of an elongated polysilicon body grown during chemical vapor deposition onto a silicon filament and reflect at least a portion of the received radiant heat energy to a reflected energy receiving region of the elongated polysilicon body or to a reflected energy receiving region of a second elongated polysilicon body, to thereby supply radiant heat energy to the reflected energy receiving region, the reflective surface having an optical power from 20 to 100 $m^{-1}$, and wherein the reflector has a frusto-pyramidal configuration.

2. The thermal decomposition reactor of claim 1, wherein the reflective surface is configured to direct reflected radiant heat energy at a three-dimensional surface, a two-dimensional area, a point, or a line on a polysilicon body surface at the reflected energy receiving region.

3. The thermal decomposition reactor of claim 1, wherein:
    the reflective surface is concave and in the shape of a portion of a paraboloid, a sphere, a tapered cylinder, or a cylinder, the cylinder having a longitudinal axis that is not parallel to a longitudinal axis of the energy emitting region of the elongated polysilicon body.

4. The thermal decomposition reactor of claim 1, wherein the reflective surface is substantially smooth with any surface irregularities having an average amplitude of less than 3 mm.

5. The thermal decomposition reactor of claim 1, wherein:
    a lower surface of the reflector defines one or more depressions configured to receive one or more protrusions of a structure on which the reflector is positioned;
    the reflector further comprises a cavity defined by portions of a lower surface and a rear surface of the reflector;
    a surface of the reflector comprises one or more features to facilitate positioning, alignment, or positioning and alignment of the reflector within the thermal decomposition reactor; or
    any combination thereof.

6. The thermal decomposition reactor of claim 1, wherein:
    the reactor contains more than one elongated polysilicon body; and
    the reflector further has a second reflective surface to receive radiant heat energy from an energy emitting region of a second elongated polysilicon body during chemical vapor deposition and reflect at least a portion of the received radiant heat energy to a reflected energy receiving region of the second elongated polysilicon body or to a region of another elongated polysilicon body within the chamber, wherein the other elongated polysilicon body is the first elongated polysilicon body or a third elongated polysilicon body within the thermal decomposition reactor.

7. The thermal decomposition reactor of claim 1, wherein:
    the reactor vessel comprises adjacent first and second tubes that are configured to receive first and second vertical portions of the elongated polysilicon body grown by chemical vapor deposition onto an inverted U-shaped silicon filament comprising two vertical silicon filaments and a horizontal silicon filament;
    the elongated polysilicon body has one or more bend portions between the first and second vertical portions of the elongated polysilicon body, which bend portions are situated outside the first and second tubes; and
    the reflector is situated such that the reflective surface is positioned to (i) receive at least some radiant heat energy emitted from the energy emitting region of the elongated polysilicon body formed during the chemical vapor deposition and (ii) reflect at least a portion of the received radiant heat energy to the reflected energy receiving region.

8. The thermal decomposition reactor of claim 7, wherein:
    the energy emitting region is a portion of the surface of the first vertical portion of the elongated polysilicon body, and the reflected energy receiving region is a portion of the surface of the elongated polysilicon body, which portion is at or near a bend portion of the elongated polysilicon body; or
    the energy emitting region is a portion of the surface of a bend portion or a horizontal portion of the elongated polysilicon body, which horizontal portion is between the first and second vertical portions, and the reflected energy receiving region is a portion of the surface of the first or second vertical portion of the elongated polysilicon body.

9. The thermal decomposition reactor of claim 1, wherein:
    the reflector is constructed of a material that does not evolve chemical species comprising Group III elements, Group V elements, metals, oxygen, or carbon during reactor operation;
    the reflector is constructed of, or plated with, a material having an emissivity <0.5; or
    a combination thereof.

10. The thermal decomposition reactor of claim 1, wherein the reflector is constructed of, or plated with, nickel, a nickel alloy, stainless steel, molybdenum, a molybdenum alloy, tungsten, a tungsten alloy, cobalt, a cobalt alloy, titanium, a titanium alloy, gold, a gold alloy, silver, a silver alloy, tantalum, or a tantalum alloy.

11. A thermal decomposition reactor for producing an elongated polysilicon body, the reactor comprising:
    a reactor vessel having a wall that defines a chamber, a gas inlet for admitting gas into the chamber, and a gas outlet for exhausting gas out of the chamber;
    a silicon filament in the chamber;
    an energy source for heating the silicon filament;
    a source of silicon-bearing gas fluidly connected to the gas inlet of the reactor vessel, wherein the silicon-bearing gas is a gas that is capable of decomposition at elevated temperatures to deposit silicon onto the silicon filament by chemical vapor deposition and grow an elongated polysilicon body; and
    at least one reflective surface situated in the chamber, the reflective surface configured to receive radiant heat energy emitted from an energy emitting region of the elongated polysilicon body grown during chemical vapor deposition and reflect at least a portion of the received radiant heat energy to a reflected energy receiving region of the elongated polysilicon body or to a region of a second elongated polysilicon body within the chamber, the reflective surface having an optical power from 20 to 100 $m^{-1}$, wherein the reflective surface is an integral portion of a component within the chamber or the reflective surface is a surface of a reflector according to claim 1 situated on a component within the chamber.

12. A method of producing an elongated polysilicon body, the method comprising:
    depositing silicon by chemical vapor deposition onto one or more heated silicon filaments heated in a reaction chamber of a reaction vessel to grow one or more elongated polysilicon bodies; and
    during the depositing, reflecting radiant heat energy off of a device according to claim 1, the reflector having a first reflective surface positioned at a location within the reaction chamber such that the first reflective surface receives radiant heat energy emitted from an energy emitting region of a first elongated polysilicon body and reflects at least a portion of the received radiant heat energy to a reflected energy receiving region of the first elongated polysilicon body or to a second elongated polysilicon body.

13. The method of claim 12, wherein (i) the energy emitting and reflected energy receiving regions are on the first elongated polysilicon body, (ii) the energy emitting region is a relatively hot region, and (iii) the reflected energy receiving region is a relatively cool region, the method further comprising:
    positioning the first reflective surface at a location within the chamber such that the radiant heat energy received from the energy emitting region and reflected to the reflected energy receiving region decreases a temperature gradient within the elongated polysilicon body.

14. The method of claim 12, wherein the first reflective surface is concave and in the shape of a portion of a paraboloid, a sphere, a tapered cylinder, or a cylinder, the cylinder having a longitudinal axis that is not parallel to a longitudinal axis of the energy emitting region of the first elongated polysilicon body when the first reflective surface is provided at the location within the chamber.

15. The method of claim 12, wherein (i) the energy emitting region is a portion of the surface of a vertical portion of the first elongated polysilicon body, (ii) the reflected energy receiving region is a portion of the surface of the elongated polysilicon body, which portion is at or near a bend portion of the first elongated polysilicon body, and (iii) the temperature gradient is within the bend portion, the method further comprising:
    positioning the first reflective surface at a location within the chamber such that received radiant heat energy is convergently reflected to the reflected energy receiving region.

16. The method of claim 12, further comprising:
    positioning the first reflective surface at a location within the chamber such that the first reflective surface is located (i) above the heated silicon filament from which the first elongated polysilicon body is grown, or (ii) on an upper rim of a first tube pair within the chamber, wherein the first tube pair comprises adjacent first and second tubes that are configured to receive first and second vertical portions of a first elongated polysilicon body grown from a first heated, inverted U-shaped silicon filament comprising two vertical silicon filaments and a horizontal silicon filament, which horizontal silicon filament is situated outside the first and second tubes.

17. The method of claim 12, further comprising:
    during the depositing, reflecting radiant energy off of a second reflective surface positioned at a location within the chamber such that the second reflective surface receives radiant heat energy emitted from the energy emitting region of the first elongated polysilicon body during the chemical vapor deposition and reflects at least a portion of the received radiant heat energy to the reflected energy receiving region of the first elongated polysilicon body.

18. The method of claim 17, wherein the chamber comprises a first tube pair comprising adjacent first and second tubes that are configured to receive first and second vertical portions of a first heated, inverted U-shaped silicon filament comprising two vertical silicon filaments and a horizontal silicon filament, which horizontal silicon filament is situated outside the first and second tubes, the method further comprising:
    positioning the first reflective surface and the second reflective surface (i) above the horizontal silicon filament or (ii) directly or indirectly on an upper rim of the first tube pair.

19. The method of claim 12, wherein a second elongated polysilicon body is grown in the chamber by chemical vapor deposition, the method further comprising:
    during the depositing, reflecting radiant energy off of a second reflective surface positioned at a location within the chamber such that the second reflective surface receives radiant heat energy emitted from an energy emitting region of the second elongated polysilicon body and reflects at least a portion of the received radiant heat energy to a reflected energy receiving region of the second elongated polysilicon body or to a region of another elongated polysilicon body within the chamber, wherein the other elongated polysilicon body is the first elongated polysilicon body or a third elongated polysilicon body within the thermal decomposition reactor.

20. The method of claim 12, further comprising:
    reflecting radiant heat energy off of a second reflective surface, wherein the second reflective surface is a second surface of the reflector, a surface of a second reflector positioned within the reaction chamber, or is provided as an integral portion of a component within the reaction chamber.

21. A method of mitigating spall formation of an elongated polysilicon body prepared in a thermal decomposition reactor, the method comprising:

depositing silicon by chemical vapor deposition onto one or more heated silicon filaments heated in a reaction chamber of a reaction vessel to grow one or more elongated polysilicon bodies; and during the depositing, reflecting with a device according to claim 1 at least a portion of radiant heat energy emitted from an energy emitting region of the one or more elongated polysilicon bodies to a reflected energy receiving region of the one or more elongated polysilicon bodies, thereby reducing spall formation in the elongated polysilicon body compared to an elongated polysilicon body produced in a thermal decomposition reactor in the absence of the device.

* * * * *